(12) United States Patent
Decker et al.

(10) Patent No.: US 8,766,396 B2
(45) Date of Patent: Jul. 1, 2014

(54) VIBRATION NOISE SHIELD IN A SEMICONDUCTOR SENSOR

(71) Applicant: Moxtek, Inc., Orem, UT (US)

(72) Inventors: Keith Decker, Pleasant Grove, UT (US); Derek Hullinger, Orem, UT (US)

(73) Assignee: Moxtek, Inc., Orem, UT (US)

( * ) Notice: Subject to any disclaimer, the term of this patent is extended or adjusted under 35 U.S.C. 154(b) by 1 day.

(21) Appl. No.: 13/667,228

(22) Filed: Nov. 2, 2012

(65) Prior Publication Data

US 2014/0124905 A1  May 8, 2014

(51) Int. Cl.
*H01L 29/66* (2006.01)

(52) U.S. Cl.
USPC .......................................... 257/484; 257/656

(58) Field of Classification Search
USPC .................................. 257/484, 656
See application file for complete search history.

(56) References Cited

U.S. PATENT DOCUMENTS

| 7,777,292 B2 * | 8/2010 | Ota et al. ...................... 257/472 |
| 8,362,586 B2 * | 1/2013 | Hatakeyama ................. 257/484 |
| 2006/0131685 A1 * | 6/2006 | Watanabe et al. ............. 257/483 |

* cited by examiner

*Primary Examiner* — Phat X Cao
(74) *Attorney, Agent, or Firm* — Thorpe North & Western LLP (57) ABSTRACT

A semiconductor device comprises a substrate, a cathode, an outer ring, an anode, an electrically insulating layer, and an electrically conducting layer. The substrate includes a semiconducting material having a first conduction type. The substrate has a first face and a second face substantially parallel to the first face. A cathode is disposed at the second face and has the first conduction type. An outer ring, having the first conduction type, is disposed at an outer perimeter of the first face of the substrate. An anode, having the second conduction type, is disposed at the first face of the substrate within an inner perimeter of the outer ring. An electrically insulating layer is disposed over the outer ring. An electrically conducting layer is disposed over the electrically insulating layer and over the outer ring. The electrically conducting layer electrically is insulated from the outer ring by the electrically insulating layer.

20 Claims, 6 Drawing Sheets

VIBRATION NOISE SHIELD IN A SEMICONDUCTOR SENSOR

FIELD OF THE INVENTION

The present application is related generally to semiconductor devices, such as PIN diodes.

BACKGROUND

Figure 10:
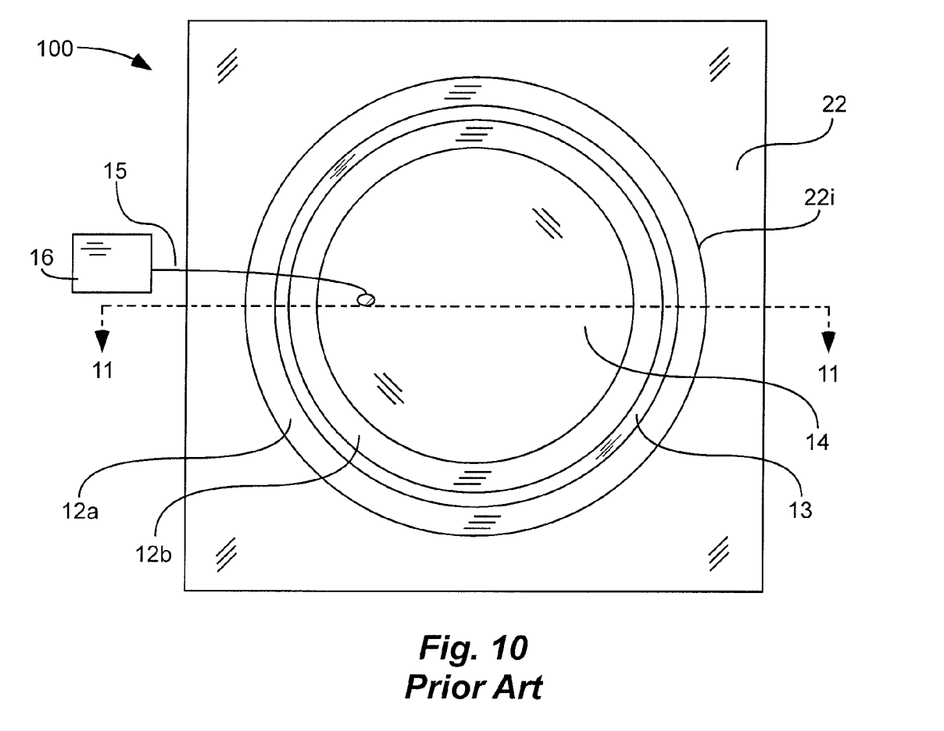
FIG. 10 is a schematic top view of a semiconductor device, including an anode, a guard ring, and an outer ring, in accordance with the prior art.
Figure 11:
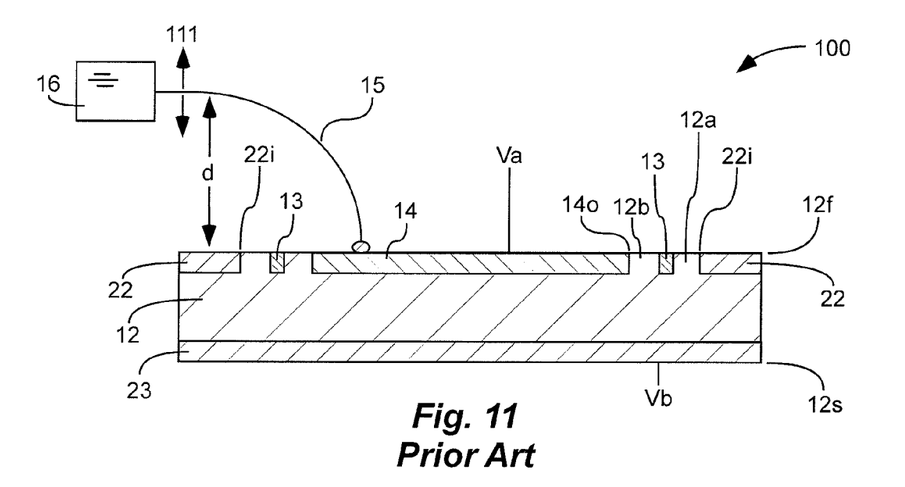
FIG. 11 is a schematic cross-sectional side view of the semiconductor device of FIG. 10 taken along line 11-11 in FIG. 10, in accordance with the prior art.

Shown in FIGS. 10-11 is a semiconductor device 100. The semiconductor device 100 can be a PIN diode. The semiconductor device 100 comprises a substrate 12, a cathode 23, an outer ring 22, an anode 14, and a guard ring 13.

The substrate has a first face 12f and a second face 12s, with the second face 12s being substantially parallel to the first face 12f.

The cathode 23 can be disposed at the second face 12s of the substrate 12. The outer ring 22 can be disposed at an outer perimeter of the first face 12f of the substrate 12. The anode 14 can be disposed at the first face 12f of the substrate 12 within an inner perimeter 22i of the outer ring 22. The guard ring 13 can be disposed at the first face 12f of the substrate 12 between the outer ring 22 and the anode 14. The guard ring 13 can be separated from the anode 14 by substrate 12b and from the outer ring 22 by substrate 12a. A purpose of the outer ring 22 is to prevent a depletion region which may be formed in the substrate from extending to an edge of the semiconductor device 100. The guard ring 13 can capture leakage current originating from an outer periphery of the semiconductor device 100.

The cathode 23, the outer ring 22, the anode 14, and the guard ring 13 can be embedded in the substrate 12 such as by implantation. The substrate 12, the cathode 23, and the outer ring 22 can comprise a semiconducting material having a first conduction type, such as n for example. The cathode 23 and the outer ring 22 can be more highly doped than the substrate 12 (n+ for example). The anode 14 and the guard ring 13 can be more highly doped than the substrate 12, and can be a second conduction type (p+ for example). The first conduction type can be opposite of the second conduction type. One conduction type may be a material that tends to have an excess of electrons, and the other conduction type may be a material that tends to have an excess of holes.

Following is an example of one use of the semiconductor device 100 for x-ray fluorescence analysis of elements in a sample, such as to determine element concentration. The anode 14 can have a voltage that is zero or close to zero. The cathode 23 can be connected to a positive voltage of around 120 volts. Due to temporary flow of electrical current through the substrate 12, the outer ring 22 can have a voltage similar to that of the cathode 23 (about 120 volts in this example).

The sample can absorb x-rays from an x-ray source. The sample can then emit elemental-specific x-rays which can impinge on the semiconductor device 100. The elemental-specific x-rays can be absorbed by the substrate 12, resulting in formation of free electrons and holes. Due to the large positive voltage on the cathode 23, and the less positive voltage (or even negative voltage) on the anode 14, the free electrons can flow to the anode 14.

The anode 14 can be connected by a wire bond 15 to an outer circuit 16. The wire bond 15 can extend over the outer ring 22 without touching the outer ring 22. Free electrons can flow from through the wire bond 15 between the anode 14 and the outer circuit 16. The free electrons are a signal that can be analyzed by the outer circuit 16 to determine elemental-specific x-ray energy, and from this elemental-specific x-ray energy, the element that emitted the x-ray.

There is a capacitance C between the wire bond 15, with a voltage typically around zero volts, and the outer ring 22, with a voltage of 120 volts in this example. A problem with operation of the semiconductor device 100 is that the wire bond 15 is typically made of very fine gage wire, which can easily vibrate 111. This wire vibration 111 can cause the capacitance C, between the wire bond 15 and the outer ring 22, to change or oscillate. A distance d between two conductors is one factor that determines capacitance. Thus a change in distance d between the outer ring 22 and the wire bond 15, due to movement or vibration of the wire bond 15, can cause a change in capacitance between the outer ring 22 and the wire bond 15.

Changing capacitance C can induce noise into the wire bond 15 as indicated by the equation Q=CV, in which Q is charge and V is voltage differential between the two conductors (120 volts in this example). Because the voltage differential V is high, changes in capacitance can result in substantial changes in charge Q. The changes in charge Q will be analyzed by the outer circuit 16. The outer circuit 16 cannot distinguish between electrons resulting from x-rays absorbed by the substrate 12 and electrons resulting from the changing capacitance. Thus, the changing capacitance C can introduce undesirable electronic noise into the signal, adversely affecting analysis of the signal, such as by causing poor resolution. This poor resolution can make it difficult to distinguish different elements in the sample. It would be beneficial to eliminate or reduce this electronic noise induced into the signal due to the changing capacitance C between the wire bond 15 and the outer ring 22.

SUMMARY

It has been recognized that it would be advantageous to eliminate or reduce electronic noise induced into a signal, from an anode to an outer circuit through a wire bond, due to changing capacitance between the wire bond and an outer ring. The present invention is directed to a semiconductor device that satisfies this need. The semiconductor device comprises a substrate, a cathode, an outer ring, an anode, an electrically insulating layer, and an electrically conducting layer. The substrate includes a semiconducting material having a first conduction type. The substrate has a first face and a second face substantially parallel to the first face. A cathode can be disposed at the second face of the substrate and can have the first conduction type. An outer ring, having the first conduction type, can be disposed at an outer perimeter of the first face of the substrate. An anode, having the second conduction type, can be disposed at the first face of the substrate within an inner perimeter of the outer ring. An electrically insulating layer can be disposed over the outer ring. An electrically conducting layer can be disposed over the electrically insulating layer and over the outer ring. The electrically conducting layer can be electrically insulated from the outer ring by the electrically insulating layer.

DETAILED DESCRIPTION

Shown in FIGS. 1-8 are semiconductor devices 10, 30, 50, and 70. The semiconductor devices can be PIN diodes. The semiconductor devices 10, 30, 50, and 70 can comprise a substrate 12, a cathode 23, an outer ring 22, and an electrically insulating layer 21, and an electrically conducting layer 11. The substrate can have a first face 12$f$ and a second face 12$s$, with the second face 12$s$ being substantially parallel to the first face 12$f$.

The cathode 23 can be disposed at the second face 12$s$ of the substrate 12. The outer ring 22 can be disposed at an outer perimeter of the first face 12$f$ of the substrate 12. The anode 14 can be disposed at the first face 12$f$ of the substrate 12 within an inner perimeter 22$i$ of the outer ring 22. The anode 14 is shown in the figures as a continuous region, such as a solid circular or cylindrical shape, but the anode can be other shapes such as a ring with substrate 12 in the center of the ring.

The electrically insulating layer 21 can be disposed over the outer ring 22. The electrically conducting layer 11 can be disposed over the electrically insulating layer 21 and over the outer ring 22. The electrically conducting layer 11 can be electrically insulated from the outer ring 22 by the electrically insulating layer 21. The electrically insulating layer can be a ceramic that is held in place by epoxy. Alternatively, it can be an oxide, such as silicon dioxide for example, that is deposited on the surface of the semiconductor. The electrically conducting layer can be a sheet of metal such as aluminum that is held in place with epoxy or that is deposited by sputtering.

The semiconductor devices 10, 30, 50, and 70 can also comprise a guard ring 13. The guard ring 13 can be disposed at the first face 12$f$ of the substrate 12 between the outer ring 22 and the anode 14. The guard ring 13 can be separated from the anode 14 by substrate 12$b$ and from the outer ring 22 by substrate 12$a$. The guard ring 13 can capture leakage current originating from an outer periphery of the semiconductor device 100.

The cathode 23, the outer ring 22, the anode 14, and the guard ring 13 can be embedded in the substrate 12, and thus in a face 12$f$ or 12$s$ of the substrate, such as by doping the substrate by implantation or diffusion. The substrate 12, the cathode 23, and the outer ring 22 can comprise a semiconducting material having a first conduction type. The anode 14 and the guard ring 13 can have a second conduction type. The first conduction type can be opposite of the second conduction type. One conduction type may be a material that tends to have an excess of electrons, and the other conduction type may be a material that tends to have an excess of holes. The first conduction type can be n and the second conduction type can be p. Alternatively, the first conduction type can be p and the second conduction type can be n.

If the first conduction type is n and the second conduction type is p, the cathode 23 and the outer ring 22 can be n-doped regions of an n-doped substrate and the anode 14 and the guard ring 13 can be p-doped regions of the n doped substrate 12. The cathode 23 and the outer ring 22 can be doped substantially more than the substrate 12, thus the cathode 23 and the outer ring 22 can be n+ doped regions of the n-doped substrate 12. The anode 14 and the guard ring 13 can be doped substantially more than the substrate 12, thus the anode 14 and the guard ring 13 can be p+ doped regions of the n-doped substrate 12.

Following is an example of one use of the semiconductor devices 10, 30, 50, and 70 for analysis of elements in a sample, such as to determine element concentration. The anode 14 can have a voltage that is zero or close to zero. The cathode 23 can be connected to a positive voltage of around 120 volts. Due to flow of electrical current through the substrate 12, the outer ring 22 will typically have a voltage similar to that of the cathode 23 (about 120 volts in this example).

The sample can absorb x-rays from an x-ray source. The sample can then emit elemental-specific x-rays which can impinge on one of the semiconductor devices 10, 30, 50, or 70. The elemental-specific x-rays can be absorbed by the substrate 12, resulting in formation of free electrons and holes. Due to the large positive voltage on the cathode 23, and the less positive voltage (or even negative voltage) on the anode 14, the free electrons can flow to the anode.

The anode 14 can be connected by a wire bond 15 to an outer circuit 16. The wire bond 15 can extend over the outer ring 22 without touching the outer ring 22. Free electrons can flow between the anode 14 and the outer circuit 16 through the wire bond 15. The free electrons are a signal that can be analyzed by the outer circuit 16 to determine elemental-specific x-ray energy, and from this elemental-specific x-ray energy, the element that emitted the x-ray.

As described in the background section regarding a prior art semiconductor device 100, there can be a capacitance C between the wire bond 15, with a voltage typically around zero volts, and the outer ring 22, with a voltage of 120 volts in this example. A problem with operation of the semiconductor device 100 of the prior art is that the wire bond 15 is typically made of very fine gage wire, which can easily vibrate 111. This wire movement or vibration 111 can cause the capacitance C, between the wire bond 15 and the outer ring 22, to change or oscillate. A distance d between two conductors is one factor that determines capacitance. Thus a change in distance d between the outer ring 22 and the wire bond 15, due to movement or vibration of the wire bond 15, can cause a change in capacitance between the outer ring 22 and the wire bond 15.

Changing capacitance C can induce noise in the wire bond 15 as indicated by the equation Q=CV, in which Q is charge and V is voltage differential between the two conductors (120 volts in this example). Because the voltage differential V is high, changes in capacitance can result in substantial changes in charge Q. The changes in charge Q will be analyzed by the outer circuit 16. The outer circuit 16 cannot distinguish between electrons resulting from x-rays absorbed by the substrate 12 and electrons resulting from the changing capacitance. Thus, the changing capacitance C can introduce undesirable electronic noise into the signal, adversely affecting analysis of the signal, such as by causing poor resolution. This poor resolution can make it difficult to distinguish different elements in the sample.

This noise can be eliminated or substantially reduced by shielding the outer ring 22 from the wire bond 15. The electrically insulating layer 21 and the electrically conducting layer 11 can substantially shield the outer ring 22 from the wire bond 15, thus minimizing or eliminating the above described noise.

There may still be changing capacitance C between the electrically conducting layer 11 and the wire bond 15, but any resulting change in charge Q can be small because a voltage differential between these two conductors will typically be very small (<2 volts). Normally the guard ring 13 and the electrically conducting layer 11 will be connected to ground, and thus can have a voltage≈0. The anode will also have a low absolute value of voltage. Thus, although a changing charge Q may be induced into the wire bond 15 due to its vibration, resulting in changing capacitance between the wire bond 15 and the conducting layer 11, this changing charge Q can be small because voltage V is small: Q=CV.

A first voltage differential ΔV1 can be applied between the cathode 23 and the anode 14. A voltage Va can be applied to the anode 14. This voltage Va can have a small absolute value, such as typically between 2 and −2. A different voltage Vb can be applied to the cathode 23. This voltage Vb can have a relatively large absolute value, such as around 120 to 150 volts. The first voltage differential ΔV1 is an absolute value difference between the anode voltage Va and the cathode voltage Vb (ΔV1=|Vb−Va|).

There can be a second voltage differential ΔV2 between the conducting layer 11 and the anode 14. A voltage Va applied to the conducting layer 11 can be zero, such as by connecting the conducting layer 11 to the guard ring 13 or by wire bond from the conducting layer 11 to a ground. The second voltage differential ΔV2 is an absolute value difference between the anode voltage Va and the conducting layer voltage Vc (ΔV2=|Va−Vc|).

In order to reduce noise generated in the signal, caused by changing capacitance between the wire bond 15 and the conducting layer 11, it can be important for the second voltage differential ΔV2 to be small, or at least that the second voltage differential ΔV2 is much smaller than the first voltage differential ΔV1. The second voltage differential can be less than 4 volts in one aspect, less than 2 volts in another aspect, or less than 1.6 volts in another aspect. The second voltage differential ΔV2 divided by the first voltage differential ΔV1 can be less than 0.1 in one aspect $$\left(\frac{\Delta V2}{\Delta V1} < 0.1\right)$$

or less than 0.02 n another aspect $$\left(\frac{\Delta V2}{\Delta V1} < 0.02\right).$$

Figure 1:
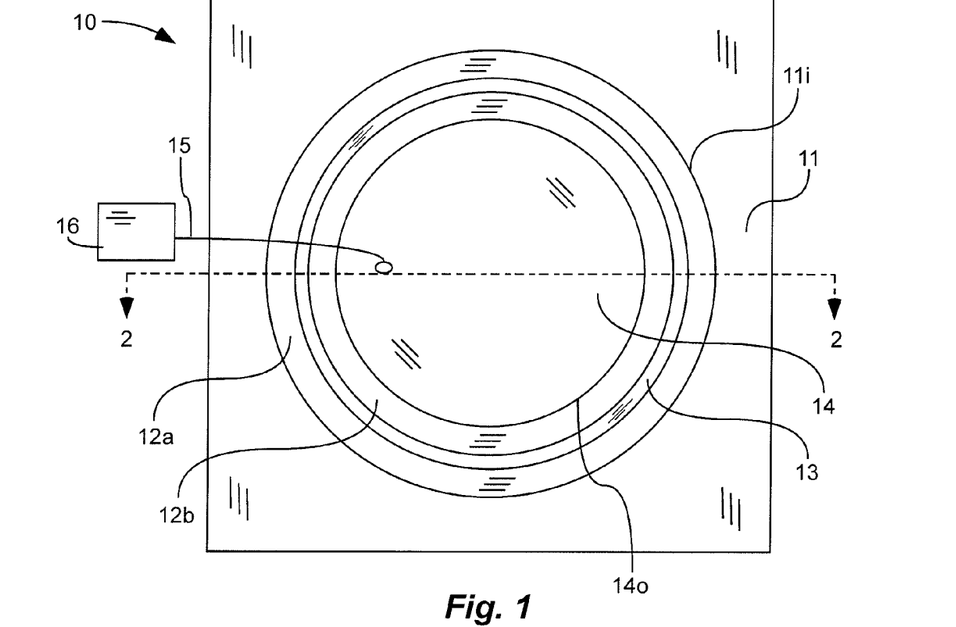
FIG. 1 is a schematic top view of a semiconductor device, including a ring of an electrically conducting layer disposed over a ring of an electrically insulating layer and over an outer ring, in accordance with an embodiment of the present invention.
Figure 2:
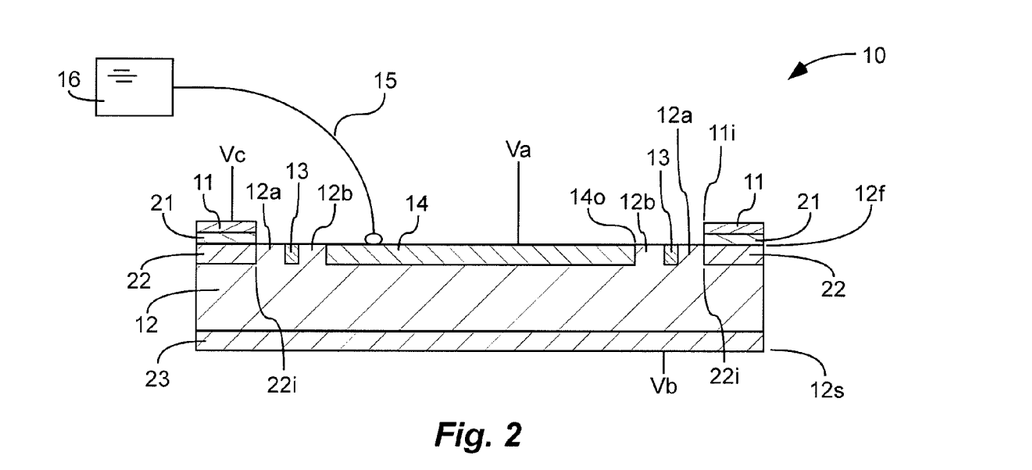
FIG. 2 is a schematic cross-sectional side view of the semiconductor device of FIG. 1 taken along line 2-2 in FIG. 1, in accordance with an embodiment of the present invention.

As shown on semiconductor device 10 of FIGS. 1 and 2, an inner perimeter 11i of the conducting layer 11 can terminate prior to an outer perimeter 14o of the anode 14. The conducting layer 11 can be a single conducting layer, with no other conducting layers disposed over the outer ring 22. The anode 14 can touch the outer ring 22, but a preferred embodiment is for the anode 14 to be separated from the outer ring 22 by substrate 12b.

Figure 3:
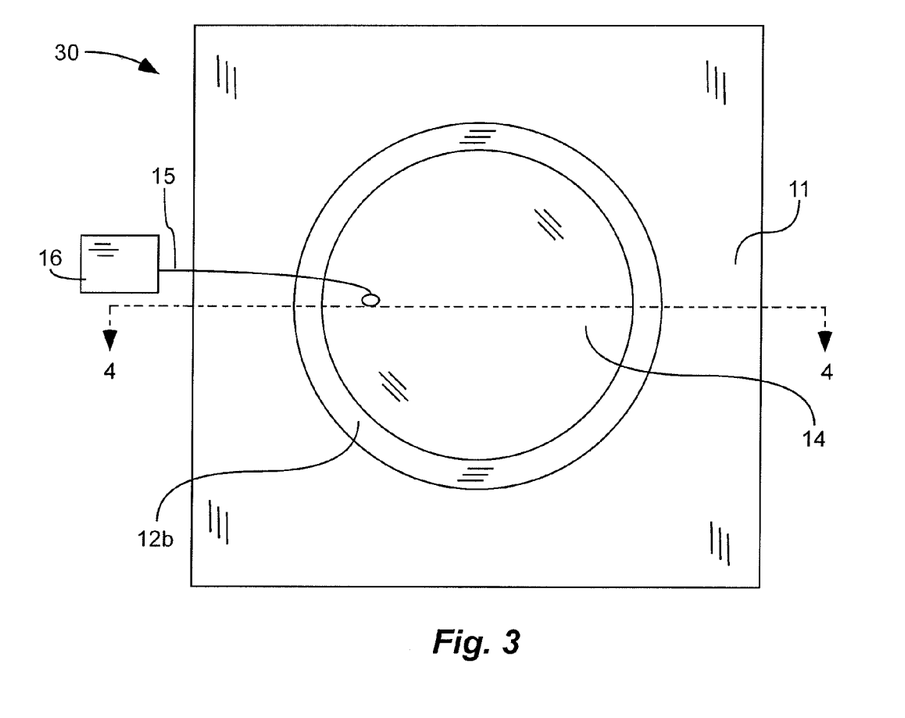
FIG. 3 is a schematic top view of a semiconductor device in which an electrically insulating layer terminates within an outer perimeter of a guard ring but before an inner perimeter of the guard ring and an electrically conducting layer extends to and physically contacts the guard ring, in accordance with an embodiment of the present invention.
Figure 4:
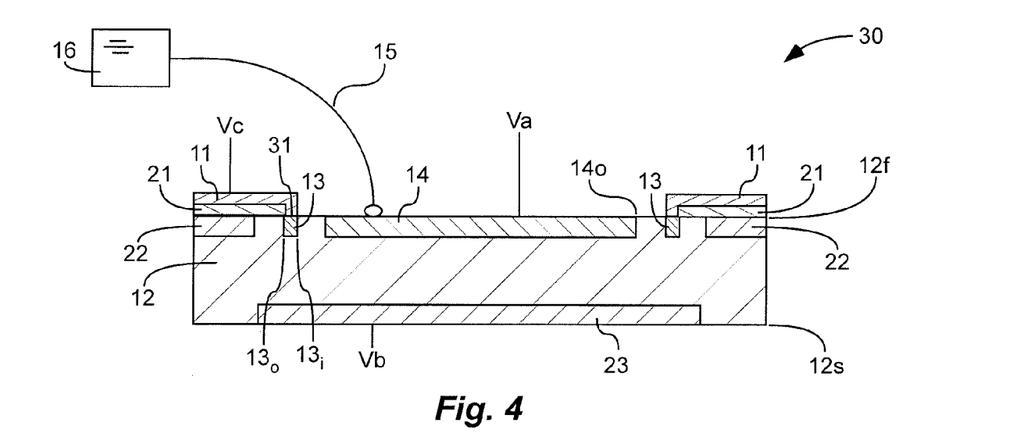
FIG. 4 is a schematic cross-sectional side view of the semiconductor device of FIG. 3 taken along line 4-4 in FIG. 3, in accordance with an embodiment of the present invention.
Figure 5:
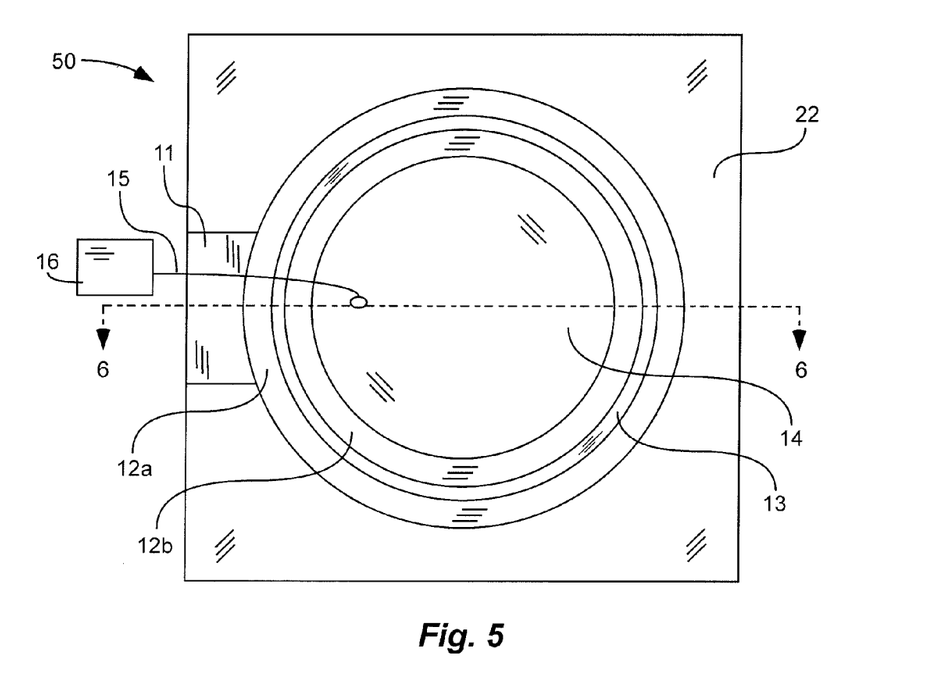
FIG. 5 is a schematic top view of a semiconductor device in which an electrically insulating layer and an electrically conducting layer extend in a path from an inner perimeter of an outer ring to an outer perimeter of the outer ring, and the path is disposed in a location on the outer ring to provide a shield to minimize noise caused by movement of a wire bond electrically connecting an anode to an external circuit, in accordance with an embodiment of the present invention.
Figure 6:
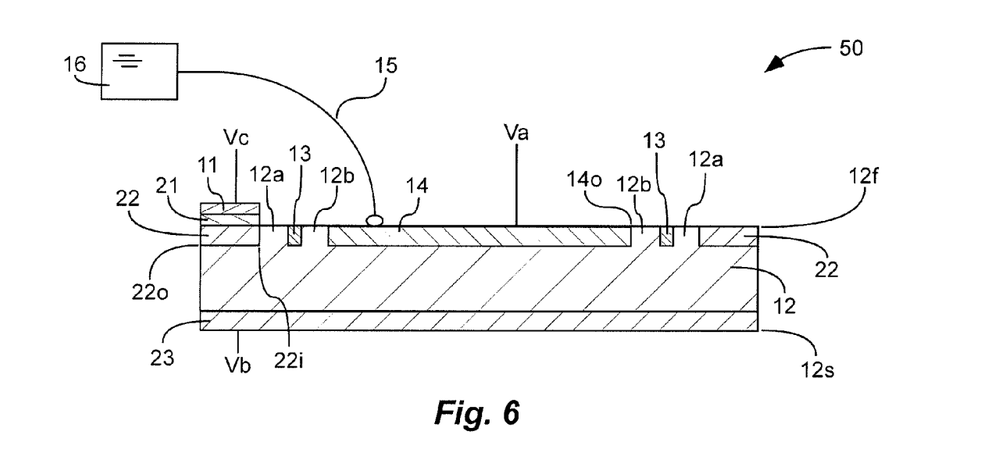
FIG. 6 is a schematic cross-sectional side view of the semiconductor device of FIG. 5 taken along line 6-6 in FIG. 5, in accordance with an embodiment of the present invention.
Figure 7:
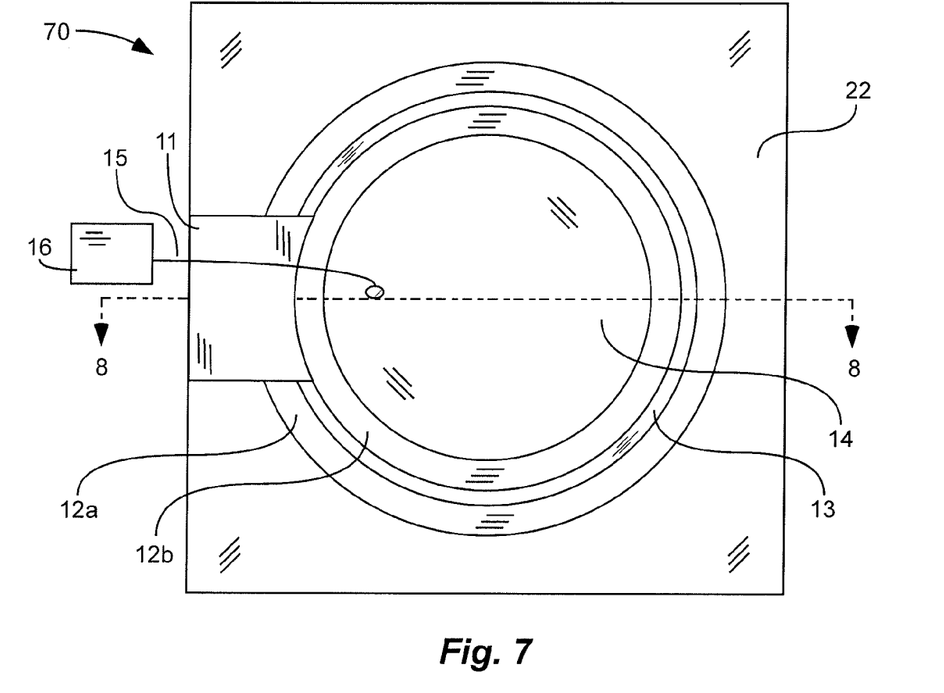
FIG. 7 is a schematic top view of a semiconductor device in which an electrically insulating layer and an electrically conducting layer extend in a path from an inner perimeter of an outer ring to an outer perimeter of the outer ring, the electrically insulating layer further extends in the path to a guard ring and terminates within an outer perimeter of the guard ring but before an inner perimeter of the guard ring, the electrically conducting layer further extends in the path to the guard ring and physically contacts the guard ring, and the path is disposed in a location on the outer ring to provide a shield to minimize noise caused by movement of a wire bond electrically connecting an anode to an external circuit, in accordance with an embodiment of the present invention.
Figure 8:
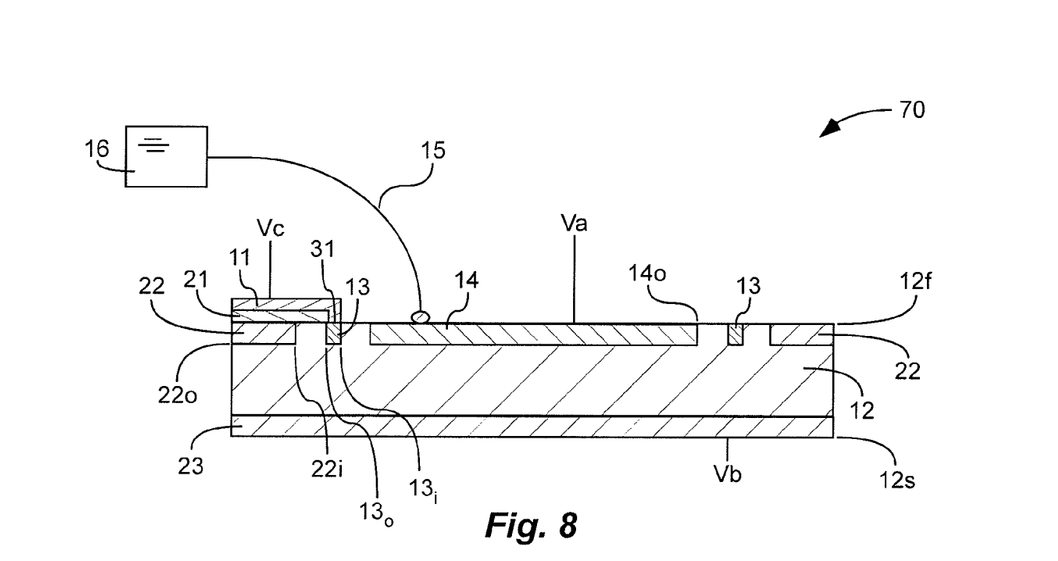
FIG. 8 is a schematic cross-sectional side view of the semiconductor device of FIG. 7 taken along line 8-8 in FIG. 7, in accordance with an embodiment of the present invention.

As shown on semiconductor device 30 of FIGS. 3-4, the cathode 23 can be disposed over a portion of the second face 12s of the substrate 12. The cathode 23 can be disposed over a central portion of the second face 12s of the substrate 12. The cathode 23 can be disposed over at least half of the second face 12s of the substrate 12. Alternatively, as shown on semiconductor devices 10, 50, and 70 of FIGS. 1-2, and 5-8, the cathode 23 can be disposed over substantially all of the second face 12s of the substrate 12. Whether the cathode is disposed over all, or only a portion, of the second face 12s of the substrate 12 depends on manufacturing considerations and the particular use of the semiconductor device.

As shown on semiconductor devices 10, 30, 50, and 70 in FIGS. 1-8, the entire second face 12s of the substrate 12 has, or is adjacent to regions having, the first conduction type, either substrate 12 or cathode 23. Thus, there are no regions having the second conduction type disposed at the second face 12s of the substrate 12. In other words, the second face of the substrate can include only the first conduction type.

As shown on semiconductor devices 30 and 70 in FIGS. 3-4 and 7-8, the electrically insulating layer 21 can terminate within an outer perimeter 13o of the guard ring 13 but before an inner perimeter 13i of the guard ring 13. The electrically conducting layer 11 can extend to and can physically contact 31 the guard ring 13. This embodiment avoids the need for a separate wire bond to electrically connect the conducting layer 11 to the guard ring 13.

The semiconductor devices 10 and 30 of FIGS. 1-4 show that the insulating layer 21 and the conducting layer 11 can be ring-shaped and can totally or substantially cover a top surface of the outer ring 22. In contrast, the insulating layer 21 and the conducting layer 11 on semiconductor devices 50 and 70 in FIGS. 5-8 cover only a relatively small portion of the outer ring 22. The insulating layer 21 and the conducting layer 11 on semiconductor devices 50 and 70 extend in a path from an inner perimeter 22i of the outer ring 22 to an outer perimeter 22o of the outer ring 22. The path can be disposed in a location on the outer ring 22 to provide a shield to minimize noise caused by movement of the wire bond 15 electrically connecting the anode 14 to external circuit 16. This location can include a region directly between the wire bond 15 and the outer ring 22. Whether the insulating layer 21 and the conducting layer 11 cover the entire outer ring 22 or only part of it, such as a path under the wire bond, depends on manufacturing considerations and the effect of amount coverage on electronic noise.

Figure 9:
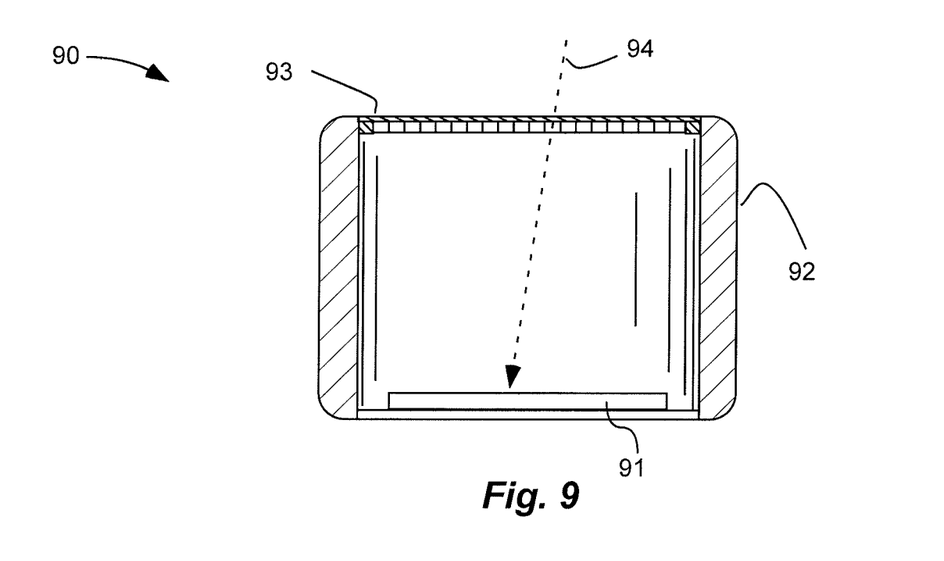
FIG. 9 is a schematic cross-sectional side view of a an x-ray detector including a semiconductor device, in accordance with an embodiment of the present invention.

As shown in FIG. 9, any of the various semiconductor devices 10, 30, 50, and 70 described herein (shown in FIG. 9 as 91) can be used in an x-ray detector 90. The x-ray detector 90 can include a hermetically sealed container 92 with a window 93 configured to allow x-rays 94 to penetrate the container 92 and impinge on the semiconductor device 91. The semiconductor device 91, along with an electrical circuit, can be configured to provide a signal for indicating x-ray energy.

What is claimed is:
1. A semiconductor device comprising:
   a. a substrate:
      i. including a semiconducting material having a first conduction type;
      ii. having a first face; and
      iii. having a second face substantially parallel to the first face;
   b. a cathode disposed at the second face of the substrate and having the first conduction type;
   c. an outer ring, having the first conduction type, disposed at an outer perimeter of the first face of the substrate;
   d. an anode, having a second conduction type, disposed at the first face of the substrate within an inner perimeter of the outer ring;
   e. an electrically insulating layer disposed over the outer ring;
   f. an electrically conducting layer disposed over the electrically insulating layer and over the outer ring; and
   g. the electrically conducting layer electrically insulated from the outer ring by the electrically insulating layer.
2. The semiconductor device of claim 1, further comprising:
   a. a first voltage differential applied between the cathode and the anode;
   b. a second voltage differential between the conducting layer and the anode; and
   c. wherein the second voltage differential divided by the first voltage differential is less than 0.1.
3. The semiconductor device of claim 2, wherein the second voltage differential divided by the first voltage differential is less than 0.02.
4. The semiconductor device of claim 2, wherein the second voltage differential is less than 1.6 volts.
5. The semiconductor device of claim 1, wherein the cathode is disposed over substantially all of the second face of the substrate.
6. The semiconductor device of claim 1, wherein an inner perimeter of the conducting layer terminates prior to an outer perimeter of the anode.
7. The semiconductor device of claim 1, wherein the conducting layer is a single conducting layer, with no other conducting layers disposed over the outer ring.
8. The semiconductor device of claim 1, wherein the anode is separated from the outer ring by the substrate.
9. The semiconductor device of claim 1, wherein:
   a. the anode is electrically connected to an outer circuit by a wire bond and a signal is transmitted from the anode through the wire bond to the outer circuit;
   b. the electrically insulating layer and the electrically conducting layer provide a shield to minimize noise generated in the signal due to movement of the wire bond and changing capacitance between the wire bond and the outer ring.
10. The semiconductor device of claim 1, further comprising a guard ring, having the second conduction type, disposed at the first face of the substrate between the outer ring and the anode and separated from both the anode and the outer ring by substrate.
11. The semiconductor device of claim 10, wherein the electrically insulating layer terminates within an outer perimeter of the guard ring but before an inner perimeter of the guard ring and the electrically conducting layer extends to and physically contacts the guard ring.
12. The semiconductor device of claim 1, wherein the insulating layer and the conducting layer extend in a path from an inner perimeter of the outer ring to an outer perimeter of the outer ring, and the path is disposed in a location on the outer ring to provide a shield to minimize noise caused by movement of a wire bond electrically connecting the anode to an external circuit.
13. The semiconductor device of claim 1, wherein the first conduction type is n, the cathode and the outer ring are n-doped regions of the substrate, the second conduction type is p, and the anode is a p-doped region of the substrate.
14. The semiconductor device of claim 1, further comprising:
   a. a hermetically sealed container, the container including a window configured to allow x-rays to penetrate the container and impinge on the semiconductor device; and
   b. the semiconductor device, along with an electrical circuit, configured to provide a signal for indicating x-ray energy.
15. The semiconductor device of claim 1, wherein the cathode, the outer ring, and the anode are doped substantially more than the substrate.
16. An x-ray detector comprising:
   a. a diode including:
      i. a substrate including a semiconducting material having a first conduction type, having a first face, and having a second face substantially parallel to the first face;
      ii. the second face of the substrate including only the first conduction type;
      iii. a cathode disposed at the second face of the substrate and having the first conduction type;
      iv. an outer ring, having a first conduction type, disposed at an outer perimeter of the first face of the substrate;
      v. an anode, having the second conduction type, disposed at the first face of the substrate within an inner perimeter of the outer ring;
      vi. a guard ring, having the second conduction type, disposed at the first face of the substrate between the outer ring and the anode and separated from both the anode and the outer ring by substrate;
      vii. an electrically insulating layer disposed over the outer ring;
      viii. an electrically conducting layer disposed over the electrically insulating layer and over the outer ring;

ix. the electrically conducting layer electrically insulated from the outer ring by the electrically insulating layer;
b. a first voltage differential applied between the cathode and the anode, a second voltage differential between the conducting layer and the anode, and wherein the second voltage differential divided by the first voltage differential is less than 0.1 and the second voltage differential is less than 2 volts;
c. the anode of the diode is electrically connected to an outer circuit by a wire bond and a signal is transmitted from the anode through the wire bond to the outer circuit;
d. the electrically insulating layer and the electrically conducting layer provide a shield to minimize noise induced into the signal due to movement of the wire bond and changing capacitance between the wire bond and the outer ring;
e. the diode is encapsulated in a hermetically sealed container, the container including a window configured to allow x-rays to penetrate the container and impinge on the diode; and
f. the diode, along with an electrical circuit, configured to provide a signal for indicating x-ray energy.

17. The semiconductor device of claim 16, wherein:
a. an inner perimeter of the conducting layer terminates prior to an outer perimeter of the anode;
b. the anode is separated from the outer ring by the substrate;
c. the conducting layer is a single conducting layer, with no other conducting layers disposed over the outer ring; and
d. the electrically insulating layer terminates within an outer perimeter of the guard ring but before an inner perimeter of the guard ring and the electrically conducting layer extends to and physically contacts the guard ring.

18. A PIN diode comprising:
a. a substrate including a semiconducting material having a first conduction type, having a first face, and having a second face substantially parallel to the first face;
b. the second face of the substrate including only the first conduction type;
c. a cathode disposed at the second face of the substrate and having the first conduction type;
d. an outer ring, having a first conduction type, disposed at an outer perimeter of the first face of the substrate;
e. an anode, having the second conduction type, disposed at the first face of the substrate within an inner perimeter of the outer ring;
f. a guard ring, having the second conduction type, disposed at the first face of the substrate between the outer ring and the anode and separated from both the anode and the outer ring by substrate;
g. the cathode, the outer ring, the anode, and the guard ring are doped substantially more than the substrate
h. an electrically insulating layer disposed over the outer ring;
i. an electrically conducting layer disposed over the electrically insulating layer and over the outer ring;
j. the electrically conducting layer electrically insulated from the outer ring by the electrically insulating layer; and
k. the insulating layer and the conducting layer extend in a path from an inner perimeter of the outer ring to an outer perimeter of the outer ring, and the path is disposed in a location on the outer ring to provide a shield to minimize noise caused by movement of any wire bond electrically connecting the anode to an external circuit.

19. The PIN diode of claim 18, wherein:
a. the conducting layer is a single conducting layer, with no other conducting layers disposed over the outer ring;
b. a voltage differential between the conducting layer and the anode is less than 1.6 volts;
c. an inner perimeter of the conducting layer terminates prior to an outer perimeter of the anode;
d. the anode is separated from the outer ring by the substrate;
e. the anode is electrically connected to an outer circuit by a wire bond and a signal is transmitted from the anode through the wire bond to the outer circuit;
f. the electrically insulating layer and the electrically conducting layer provide a shield to minimize noise induced into the signal due to movement of the wire bond and changing capacitance between the wire bond and the outer ring.

20. The PIN diode of claim 19, further comprising:
a. a hermetically sealed container, the container including a window configured to allow x-rays to penetrate the container and impinge on the diode; and
b. the diode, along with an electrical circuit, configured to provide a signal for indicating x-ray energy.

\* \* \* \* \*